United States Patent
Huang (10) Patent No.: US 10,412,836 B2
(45) Date of Patent: Sep. 10, 2019

(54) THINNED FLEXIBLE POLYIMIDE SUBSTRATE AND METHOD FOR MANUFACTURING THE SAME

(71) Applicant: Microcosm Technology Co., LTD, Tainan (TW)

(72) Inventor: Tang-Chieh Huang, Tainan (TW)

(73) Assignee: Microcosm Technology Co., Ltd., Tainan (TW)

( * ) Notice: Subject to any disclaimer, the term of this patent is extended or adjusted under 35 U.S.C. 154(b) by 0 days.

(21) Appl. No.: 16/200,425

(22) Filed: Nov. 26, 2018

(65) Prior Publication Data
US 2019/0191568 A1 Jun. 20, 2019

(30) Foreign Application Priority Data
Dec. 15, 2017 (TW) .............................. 106144187 A (51) Int. Cl.
| H05K 1/02 | (2006.01) |
| H05K 1/09 | (2006.01) |
| H05K 1/11 | (2006.01) |
| H05K 1/16 | (2006.01) |
| H05K 3/00 | (2006.01) |
| H05K 3/30 | (2006.01) |
| H05K 3/36 | (2006.01) |
| H05K 3/46 | (2006.01) |
| H05K 3/02 | (2006.01) |
| H05K 3/38 | (2006.01) |
| H05K 1/03 | (2006.01) |
| H05K 3/24 | (2006.01) |
| H05K 3/06 | (2006.01) |

(52) U.S. Cl.
CPC ............. *H05K 3/022* (2013.01); *H05K 1/028* (2013.01); *H05K 1/0326* (2013.01); *H05K 1/0346* (2013.01); *H05K 1/092* (2013.01); *H05K 3/38* (2013.01); *H05K 3/027* (2013.01); *H05K 3/06* (2013.01); *H05K 3/241* (2013.01); *H05K 2203/0723* (2013.01)

(58) Field of Classification Search
CPC ... H05K 1/02; H05K 1/09; H05K 1/11; H05K 1/16; H05K 3/00; H05K 3/30; H05K 3/36; H05K 3/46
USPC ......... 174/68.1, 254–260; 29/829, 830, 841; 361/803
See application file for complete search history.

(56) References Cited

U.S. PATENT DOCUMENTS

| 5,502,889 A * | 4/1996 | Casson ................. H05K 3/323 156/52 |
| 2004/0183883 A1* | 9/2004 | Suzuki ................. G03G 5/0578 347/118 |

(Continued)

*Primary Examiner* — Xiaoliang Chen
(74) *Attorney, Agent, or Firm* — Haverstock & Owens LLP (57) ABSTRACT

The present invention provides a thinned flexible polyimide substrate and a method for manufacturing the same. The thinned flexible polyimide substrate comprises a polyimide resin, a conductor layer, and a polyimide insulating layer. The polyimide resin has a linear thermal expansion coefficient of less than 40 ppm/K. The conductor layer is formed of a plurality of stacked metal nanoparticles having pores therebetween, and each of the pores has a size between 0.1 µm and 1 µm. A portion of the polyimide resin fills into the pores. The polyimide insulating layer is formed of the polyimide resin coated on the conductor layer.

8 Claims, 4 Drawing Sheets

(56) References Cited

U.S. PATENT DOCUMENTS

| | | | |
|---|---|---|---|
| 2005/0191511 A1* | 9/2005 | Aoki | H05K 3/1266 428/621 |
| 2009/0025965 A1* | 1/2009 | Kanemaru | H01L 23/49838 174/255 |
| 2009/0025971 A1* | 1/2009 | Kanemaru | H01L 23/5389 174/260 |
| 2009/0306329 A1* | 12/2009 | Hasegawa | C07D 307/89 528/289 |
| 2010/0277885 A1* | 11/2010 | Tatsuzawa | C09J 9/02 361/803 |
| 2012/0305073 A1* | 12/2012 | Hayase | H01G 9/2068 136/256 |
| 2014/0320777 A1* | 10/2014 | Fukushima | G02F 1/133305 349/43 |
| 2016/0075830 A1* | 3/2016 | Fukukawa | H05K 1/0346 174/258 |
| 2017/0012015 A1* | 1/2017 | Tsukao | B32B 27/08 |
| 2017/0251941 A1* | 9/2017 | Hatakeyama | A61B 5/0408 |

* cited by examiner

THINNED FLEXIBLE POLYIMIDE SUBSTRATE AND METHOD FOR MANUFACTURING THE SAME

BACKGROUND OF THE INVENTION

Field of the Invention

The present invention relates to a polyimide substrate and a method for manufacturing the same, and, in particular, to a thinned flexible polyimide substrate that is made by a specific process and has a specific structure.

Description of the Prior Art

The development of flexible substrates has gone from the early adhesive flexible substrates (3-layer FCCL) to the adhesiveless flexible substrates (2-layer FCCL). Among them, 2-layer FCCL eliminates a layer of adhesive, which not only reduces the overall thickness of the flexible substrate material, but also has better heat resistance, dimensional stability, flame retardancy, folding resistance and other characteristics, just in line with the demand and development trends, such as weight reduction, thinning, and functional enhancement, of electronic products. However, whether it is 2-layer FCCL or 3-layer FCCL, it must be patterned by a conventional etching process: removing part of the copper foil of the conductor layer to form patterned lines such as wires, vias, and grids. This process not only does not meet the environmental protection trend, but also encounters a large bottleneck in the face of the trend of thin lines and small apertures of the current pattern.

In order to meet the requirements of fine line and small aperture of the pattern, in the development of the flexible substrate patterning process, the processing methods, such as full addition method and semi-additive method, are gradually developed. The thinned conductor layer material applied to the above processes includes a metallized polyimide film achieved by a wet process or a thin copper layer formed on the surface of polyimide film by sputtering. The former that still has reliability-related problems has not been widely used in the above process technology, and though the copper foil substrate made by the sputtering method has been matured for many years and widely used in COF (Chip On Film) carrier, the production of this material must have huge equipment investment, including vacuum sputtering equipment, electroplating equipment and so on. Therefore, if a large amount of this material is used to form the flexible substrate with fine lines in the future, it will inevitably face problems, such as high cost and low productivity. Further, in addition to the above two methods, another method is direct patterning, which forms a patterned circuit by screen printing or ink printing directly on the polymer substrate, such as a polyimide film or a polyester film, using metal ink or metal paste (metal gel) prepared from metal particles or ions. The patterned circuit is then sintered to form a continuous dense wire. Although this method can eliminate the lithography process and reduce environmental pollution, the metal particles only accumulate on the surface of the substrate, and the polymer substrate cannot enter the pores of the conductor layer, so the adhesion between the conductor layer and the substrate is not good, resulting in peeling and other issues easily.

SUMMARY OF THE INVENTION

The present invention provides a thinned flexible polyimide substrate with a novel structure and a method for manufacturing the same, in which the polyimide resin is embedded in the pores of the conductor layer to form an insulating layer with good adhesion.

According to the present invention, a thinned flexible polyimide substrate is provided. The thinned flexible polyimide substrate comprises a polyimide resin, a conductor layer, and a polyimide insulating layer. The polyimide resin has a linear thermal expansion coefficient of less than 40 ppm/K. The conductor layer is formed of a plurality of stacked metal nanoparticles having pores therebetween, and each of the pores has a size between 0.1 µm and 1 µm. A portion of the polyimide resin fills into the pores. The polyimide insulating layer is formed of the polyimide resin coated on the conductor layer.

In one embodiment, the polyimide resin of the thinned flexible polyimide substrate described above is one of a thermoset polyimide resin, a thermoplastic polyimide resin, and a soluble polyimide resin.

In one embodiment, the polyimide resin described above is formed by polymerizing at least one dianhydride monomer and at least one diamine monomer, the dianhydride monomer includes p-phenylene bis(trimellitate anhydride), 2,2'-bis-(3,4-dicarboxyphenyl)hexafluoropropane dianhydride, 4,4'-diphenylether tetraanhydride, pyromellitic dianhydride, biphenyltetracarboxylic dianhydride, 3,3',4,4'-benzophenonetetracarboxylic dianhydride, 3,3',4,4'-diphenylsulfonetetraanhydride, 4,4'-(hexafluoropropylene) bis-phthalic anhydride and 4,4'-(4,4'-isopropyldiphenoxy) bis(phthalic anhydride); and the diamine monomer includes 4,4'-diaminodiphenyl ether, 4,4'-diaminodiphenylmethane, 2,2'-bis[4-(4-aminophenoxy)phenyl]propane, 2, 2'-bis[4-(4-aminophenoxy) phenyl]propane, 4,4'-diaminodiphenyl sulfone, 3,3'-diaminodiphenyl sulfone, 1,3-bis(4-aminophenoxy)benzene, 4,4'-diaminobenzanilide, (4-aminophenyl) 4-aminobenzoate, 2-(4-aminophenyl)-5-aminobenzoxazole, di-p-aminophenyl terephthalate, p-phenylenediamine, 2,2'-bis(trifluoromethyl)benzidine, 4,4'-diamino-2,2'-dimethyl-1,1'-biphenyl and 2,2-bis[4-(4-aminophenoxy)phenyl]-1,1,1,3,3,3-hexafluoropropane.

In one embodiment, the polyimide resin has a viscosity value between 0.4 dL/g and 1.0 dL/g.

In one embodiment, the metal nanoparticles are made of silver, copper, nickel, gold, titanium, or a combination thereof.

In one embodiment, the metal nanoparticles have a particle size between 100 nm and 1000 nm.

In one embodiment, the conductor layer has a thickness between 500 nm and 3 µm.

According to another embodiment of the present invention, a method for manufacturing a thinned flexible polyimide substrate is provided. The method comprises the following steps:

(a) providing a carrier;

(b) applying a plurality of metal nanoparticles onto the carrier to form a conductor layer, wherein a plurality of pores are formed between the stacked metal nanoparticles, and each of the pores has a size of 0.1 µm to 1 µm;

(c) covering the conductor layer of the step (b) with a polyimide resin such that a portion of the polyimide resin penetrates and fills into the pores, and the other portion of the polyimide resin forms a polyimide insulating layer on the conductor layer; and (d) separating the carrier from the conductor layer of step (c) to form the thinned flexible polyimide substrate.

In one embodiment, the method for manufacturing a thinned flexible polyimide substrate further includes the following steps:

(e) patterning the conductor layer; and (f) forming a conductive metal layer on the patterned conductor layer of step (e).

In one embodiment, the method for manufacturing a thinned flexible polyimide substrate further includes the following steps:

(g) forming a conductive metal layer on the conductor layer.

In one embodiment, the conductive metal layer is formed by electroplating.

In one embodiment, the material of the carrier is glass, PET, polyimide, copper, aluminum or stainless steel.

In one embodiment, in step (e), the conductor layer is patterned by laser engraving or chemical etching.

The above and other aspects of the invention will be apparent from the detailed description of the embodiments with reference to the accompanying drawings.

DETAILED DESCRIPTION OF THE EMBODIMENTS

Figure 1:
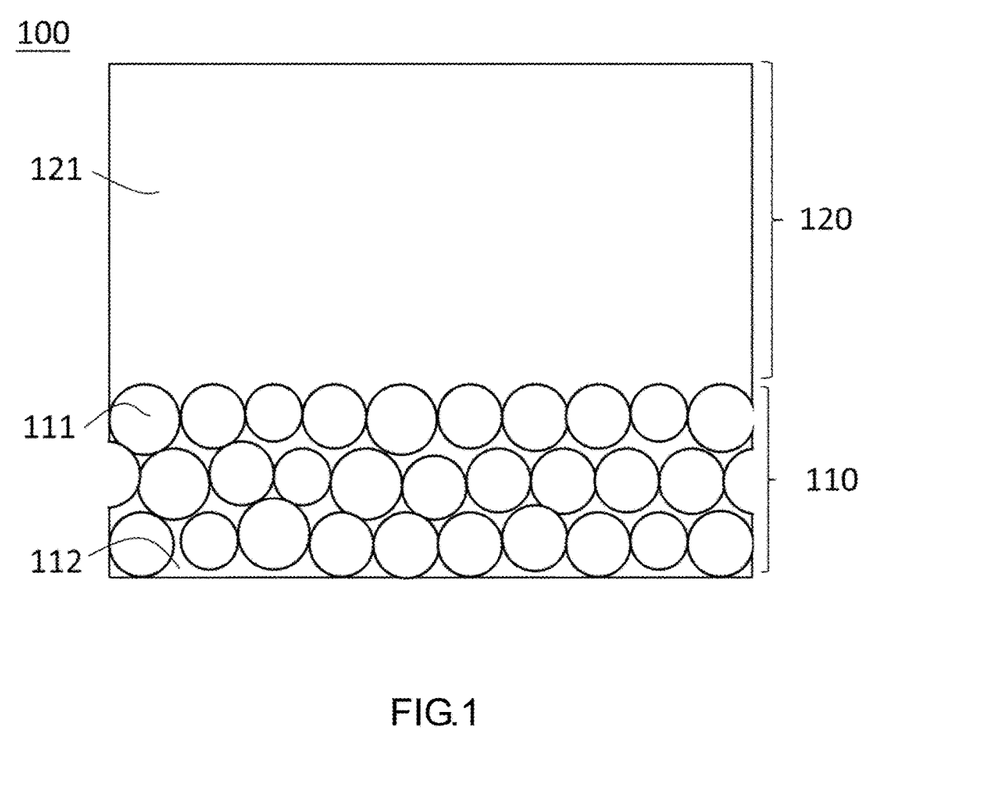
FIG. 1 is a schematic structural view of a thinned flexible polyimide substrate according to an embodiment of the present invention.

Please refer to FIG. 1, which is a schematic structural view of a thinned flexible polyimide substrate according to an embodiment of the present invention. The thinned flexible polyimide substrate 100 is a two-layer structure composed of a conductor layer 110 and a polyimide insulating layer 120. The conductor layer is composed of a stack of nanoparticles 111 having a plurality of pores 112 in the interior, and the pores have a size of 0.1 to 1 μm. The polyimide insulating layer is composed of polyimide resin 121, and a portion of the polyimide resin 121 is infiltrated into the conductor layer 110 and filled in the pores 112 of the conductor layer 110.

Figure 2:
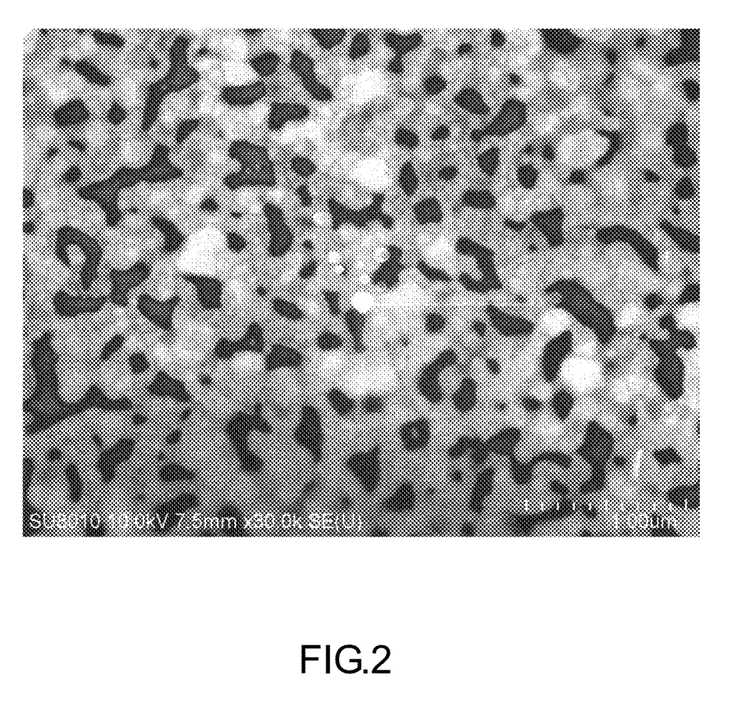
FIG. 2 is a SEM image of the conductor layer of the thinned flexible polyimide substrate according to an embodiment of the present invention.

The conductor layer 110 can be made of the metal paste (metal gel) prepared by the metal nanoparticles 111 or the metal ink containing metals in ionic form. The metal ink can be regenerated as metal nanoparticles after being heated and reduced. The metal nanoparticle 111 has a particle diameter of 100 to 1000 nm, preferably 200 to 500 nm. The metal ink or metal nanoparticles of a specific size were selected, and after sintering to become shaped and stacking, a plurality of pores 112 were formed internally. The pores were observed under SEM, and the sizes of the pores ranged from 0.1 to 1 μm (as shown in FIG. 2, the black portion represents the pore). If the pores are too small, it is not easy for the polyimide resin to be filled, and if the pores are too large, the conductivity of the conductor layer would be lowered. The thickness of the conductor layer after stacking was 500 nm to 3 μm, preferably 1-2 μm. If the conductor layer is too thin, it cannot be firmly bonded to the polyimide insulating layer. If the conductor layer is too thick, the thinning effect cannot be achieved.

The metal nanoparticles 111 are preferably selected from the group consisting of silver, gold, copper, nickel, titanium, or a combination thereof, but are not limited thereto. The source of the metal nanoparticle is not limited to the paint of metal nanoparticles, and the conductor layer may also be made of the stacking of nanoparticles formed from the reduction of the metal ion solution.

A portion of the polyimide resin 121 is filled in the plurality of pores 112 of the conductor layer 110, and even penetrates the conductor layer 110. Another portion of the polyimide resin 121 forms the polyimide insulating layer 120 on the conductor layer. Therefore, there is strong adhesion between the polyimide insulating layer 120 and the conductor layer 110, and the conductor layer 110 (or the circuit pattern thereon) is not easily peeled off.

The polyimide resin 121 is obtained by imidizing a solution of a polyamic acid, a precursor of polyimide. The polyamic acid is formed by dissolving in an organic solvent an equal molar amount of at least one dianhydride monomer and at least one diamine monomer, which are then stirred under controlled temperature conditions until the polymerization of the dianhydride and the diamine is completed.

The organic solvent for dissolving the diamine monomer and the dianhydride monomer may be N,N-dimethylacetamide, N,N-diethylacetamide, N,N-dimethylformamide or N-methyl-2-pyrrolidone.

The dianhydride monomer may be selected from the group consisting of p-phenylene bis(trimellitate anhydride), 2,2'-bis-(3,4-dicarboxyphenyl)hexafluoropropane dianhydride, 4,4'-diphenylether tetraanhydride, pyromellitic dianhydride, biphenyltetracarboxylic dianhydride, 3,3',4,4'-benzophenonetetracarboxylic dianhydride, 3,3',4,4'-diphenylsulfonetetraanhydride, 4,4'-(hexafluoropropylene) bis-phthalic anhydride and 4,4'-(4,4'-isopropyldiphenoxy) bis(phthalic anhydride).

The diamine monomer may be selected from the group consisting of 4,4'-diaminodiphenyl ether, 4,4'-diaminodiphenylmethane, 2,2'-bis[4-(4-aminophenoxy)phenyl]propane, 2, 2'-bis[4-(4-aminophenoxy)phenyl]propane, 4,4'-diaminodiphenyl sulfone, 3,3'-diaminodiphenyl sulfone, 1,3-bis(4-aminophenoxy)benzene, 4,4'-diaminobenzanilide, (4-aminophenyl) 4-aminobenzoate, 2-(4-aminophenyl)-5-aminobenzoxazole, di-p-aminophenyl terephthalate, p-phenylenediamine, 2,2'-bis(trifluoromethyl)benzidine, 4,4'-diamino-2,2'-dimethyl-1,1'-biphenyl and 2,2-bis[4-(4-aminophenoxy)phenyl]-1,1,1,3,3,3-hexafluoropropane.

The composition of polyamic acid (polyimide precursor) disclosed above is merely an example, and the dianhydride monomer and the diamine monomer actually used are not limited to the above materials. All the polyimide resin having a linear coefficient of thermal expansion (CTE) of less than 40 ppm/K (for example, any one of the thermosetting polyimide resin, the thermoplastic polyimide resin, and the soluble polyimide resin) can be used as the polyimide resin of the present invention.

The viscosity of the polyimide resin is preferably from 0.4 to 1.0 dL/g. If the polyimide resin is soluble, then measure the viscosity of the polyimide resin; and if it is an insoluble polyimide (the general polyimide), then measure the viscosity of the polyamic acid. Too low a viscosity means that the molecular weight of the polyimide is too small to cause film formation, i.e. the phenomenon that the film of low molecular weight is easily disintegrated. When the viscosity is too high, it is not easy to flow into the pores of the conductor layer.

Figure 3A:
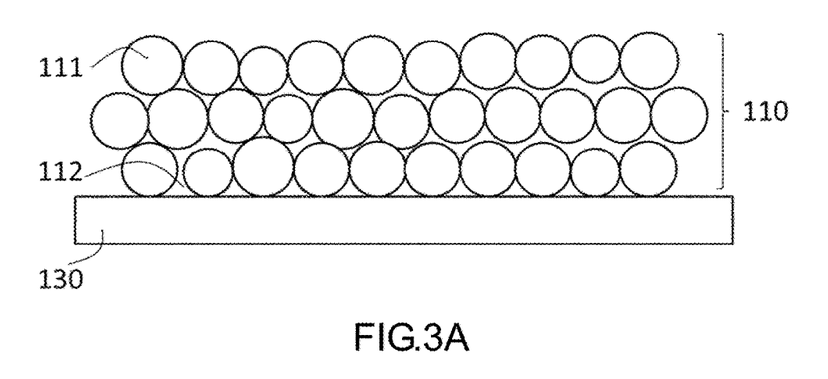
FIGS. 3A to 3C illustrate a method for manufacturing a thinned flexible polyimide substrate according to an embodiment of the present invention.

Hereinafter, a method for manufacturing a thinned flexible polyimide substrate will be described with reference to FIGS. 3A to 3C:

First, as shown in FIG. 3A, a metal gel containing metal nanoparticles 111 is applied onto a carrier 130 and then sintered to form a conductor layer 110. The solid content (metal content) in the metal gel is preferably from 60 to 85 weight percent. The metal gel can be applied to the carrier by a coating method, such as spin coating, spray coating, screen printing, blade coating, slit coating, or wet film coating of wire bar type, and then dried and sintered to form a preliminary conductor layer. The method of heat drying can be carried out, for example, by placing a metal gel-coated carrier in an oven at about 80-120° C. for drying. The sintering method is, for example, placing the dried carrier described above in an oven rich in an inert gas, such as nitrogen or argon, and then subjecting the metal gel to sintering at a temperature of 200 to 350° C. to form the conductor layer 110 including a plurality of pores 112. The pores 112 are formed from the stacking of metal nanoparticles 111 having a size ranging from 0.1 µm to 1 µm. The metal of the conductor layer described above is preferably, but not limited to, one selected from the group consisting of silver, gold, copper, nickel, titanium, and a combination thereof. The thickness of the conductor layer is preferably from 500 nm to 3 µm.

The carrier 130 refers to a support material, on which the metal gel may be coated and dried, and may include the plastic substrate, such as the polyimide substrate, the polyamide substrate, or the like; the metal substrate, such as copper, aluminum, or stainless steel substrate; or the glass substrate.

Figure 3B:
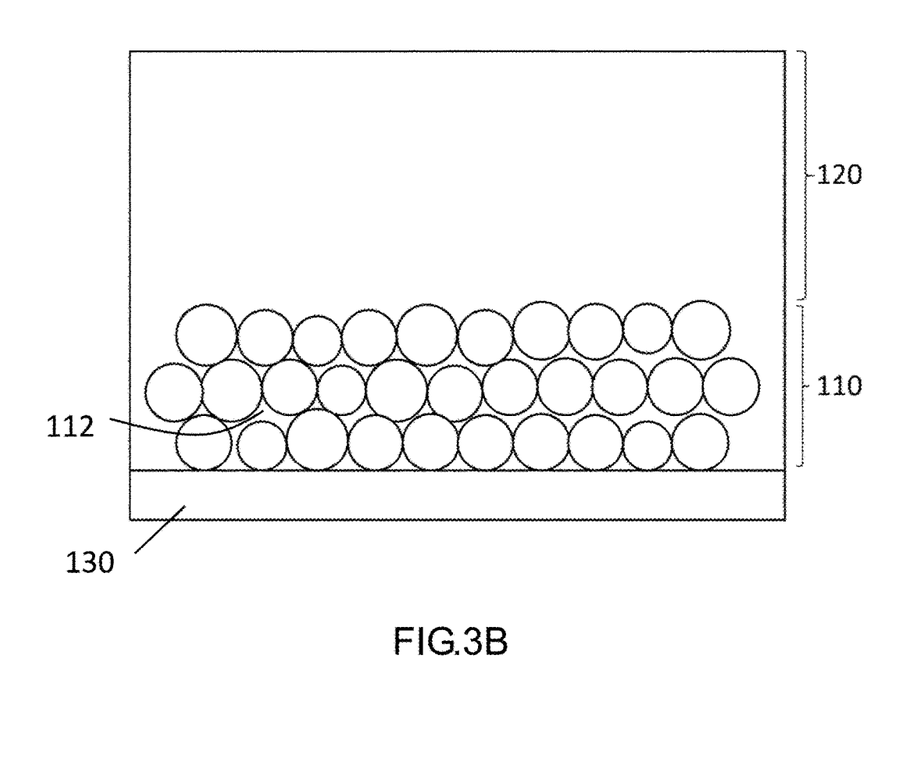

Next, as shown in FIG. 3B, the polyimide resin 121 is applied onto the conductor layer 110 to form the polyimide insulating layer 120. Here, the precursor of the polyimide resin, i.e. the polyamic acid solution, is first applied by spin coating, spray coating, screen printing, flexographic printing, blade coating, slit coating, or wet film coating of wire bar type onto the conductor layer 110 (and the carrier 130), and then the polyamic acid solution is imidized to form the polyimide resin. The method of imidization can be carried out by high temperature curing, for example, heating the polyamic acid continuously or in stages at a temperature of 250 to 350° C., or using the chemical conversion, which adds a catalyst to assist the dehydration reaction. A portion of the polyimide resin 121 penetrates into the plurality of pores 111 of the conductor layer 110, and even penetrates through the pores and contacts the carrier 130; and another portion of the polyimide resin 121 forms a polyimide insulating layer 120 on the conductor layer 110. In particular, although the metal nanoparticles stacked in the conductor layer 110 have pores therebetween, they are still in contact with each other, and even if the polyimide resin 121 (insulator) are partially filled in the pores, the conductor layer 110 is still a conductor.

Figure 3C:
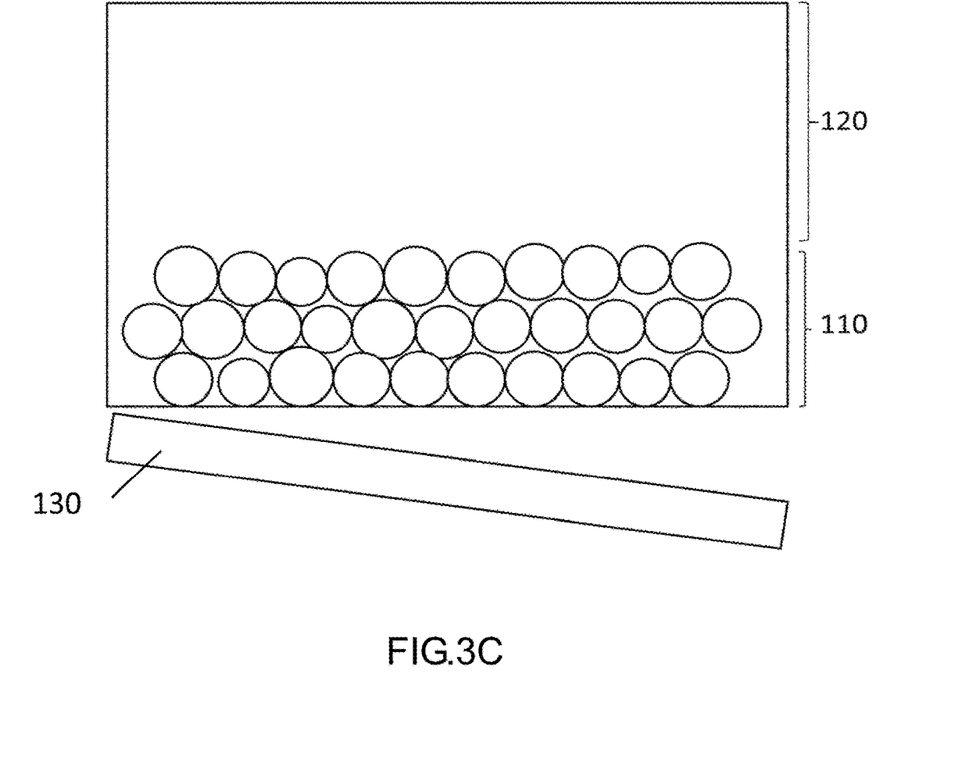

Finally, as shown in FIG. 3C, the carrier 130 is peeled off/removed from the conductor layer 110, and the thinned flexible polyimide substrate of the present invention is completed.

According to the above steps, a polyimide substrate having a thinned conductor layer can be produced, and the polyimide insulating layer has good adhesion with the conductor layer.

Furthermore, the conductor layer of the thinned flexible polyimide substrate described above may be patterned to form the wiring. The method of patterning the conductor layer is not particularly limited, and generally can use laser engraving, chemical etching, or the like to achieve the patterning. For example, the conductor layer of the thinned flexible polyimide substrate can be coated with a photoresist, which can be exposed and developed to form a photoresist pattern. The metal layer at the region where the photoresist pattern doesn't exist is removed by wet etching, and finally the photoresist is removed by the photoresist stripper.

After patterning the conductor layer of the thinned flexible polyimide substrate of the present invention, it can be further thickened by wet plating, wherein electrolytic plating is preferred. In particular, the step of thickening the conductor layer can be performed before or after patterning the conductor layer.

A substrate with double-sided conductor layers can be produced in accordance with the method for manufacturing a thinned flexible polyimide substrate described above. In detail, after the thinned flexible polyimide substrate 100 as shown in FIG. 1 is completed, the following steps may be performed: (1) a bonding layer may be coated on the polyimide insulating layer 120, and (2) the polyimide surface of another thinned flexible polyimide substrate 100 and the bonding layer are further laminated and cured. Finally, a polyimide substrate with double-sided conductor layers can be obtained, and the polyimide substrate has a "conductor layer-polyimide insulating layer-adhesion layer-polyimide insulating layer-conductor layer" structure.

The material of the bonding layer coated in the above step (1) may include an adhesive, such as epoxy resin or polyimide resin, and the adhesive is applied onto the polyimide surface of the thinned flexible polyimide substrate by a coating method, such as spin coating, screen printing, flexographic printing, blade coating, slit coating, wet film coating of wire bar type, and then dried.

In step (2), the polyimide surface of another thinned flexible polyimide substrate and the bonding layer are laminated, and finally cured. The curing temperature varies depending on the adhesive, and is generally from 150 to 300° C. After the curing, the substrate with double-sided conductor layers is completed.

Synthesis Example 1

24.20 g (0.076 mole) of 2,2'-bis(trifluoromethyl)benzidine [TFMB], 1.85 g (0.017 mole) of p-phenylenediamine [PDA], 2.36 g (0.008 mole) of 1,3-bis(4-aminophenoxy)benzene [TPE-R], and 244.37 g of N-methyl-2-pyrrolidone [NMP] were placed in a three-necked flask. After stirring at 30° C. until completely dissolved, 41.75 g (0.091 mole) of p-phenylene bis(trimellitate anhydride) [TAHQ] and 2.83 g (0.005 mole) of 4,4'-(4,4'-isopropyldiphenoxy) bis(phthalic anhydride) [PBADA] were further added, followed by continuous stirring and reaction at 25° C. for 24 hours. The polyamic acid solution of Synthesis Example 1 was obtained, which had a viscosity of 0.8 dL/g.

Synthesis Example 2

8.97 g (0.028 mole) of 2,2'-bis(trifluoromethyl)benzidine [TFMB], 2.40 g (0.012 mole) of 4,4'-diaminodiphenyl ether [ODA], and 100 g of dimethylacetamide [DMAc] were placed in a three-necked flask. After stirring at 30° C. until completely dissolved, 10.66 g (0.024 mole) of 2,2'-bis-(3, 4-dicarboxyphenyl)hexafluoropropane dianhydride [6FDA] and 4.7 g (0.016 mole) of biphenyltetracarboxylic dianhydride [BPDA] were further added, followed by continuous stirring and reaction at 25° C. for 24 hours. The polyamic acid solution of Synthesis Example 2 was obtained, which had a viscosity of 0.75 dL/g.

Synthesis Example 3

16.42 g (0.04 mole) of 2,2'-bis[4-(4-aminophenoxy)phenyl]propane [BAPP] and 100 g of dimethylacetamide [DMAc] were placed in a three-necked flask. After stirring at 30° C. until completely dissolved, 11.76 g (0.04 mole) of biphenyltetracarboxylic dianhydride [BPDA] was further added, followed by continuous stirring and reaction at 25° C. for 24 hours. The polyamic acid solution of Synthesis Example 3 was obtained, which had a viscosity of 1.2 dL/g.

Synthesis Example 4

11.52 g (0.036 mole) of 2,2'-bis(trifluoromethyl)benzidine [TFMB] and 100 g of dimethylacetamide [DMAc] were placed in a three-necked flask. After stirring at 30° C. until completely dissolved, 11.76 g (0.04 mole) of biphenyltetracarboxylic dianhydride [BPDA] was further added, followed by continuous stirring and reaction at 25° C. for 24 hours. The polyamic acid solution of Synthesis Example 4 was obtained, which had a viscosity of 0.3 dL/g.

Example 1

The metal gel (containing nano silver having a particle diameter of 150±20 nm) was applied onto the glass carrier by spin coating, and subject to surface drying at 100° C. and sintering at a temperature of 250° C. to form a conductor layer. Next, the polyamic acid solution of Synthesis Example 1 was applied onto the conductor layer. After curing at 350° C., the conductor layer was separated from the carrier to obtain the thinned flexible polyimide substrate of Example 1.

Example 2

The metal ink was applied onto the glass carrier by spin coating, and then subject to surface drying at 100° C. and sintering at a temperature of 250° C., during which ions in the metal ink were reduced to particles to form a conductor layer. Next, the polyamic acid solution of Synthesis Example 2 was applied onto the conductor layer. After curing at 350° C., the conductor layer was separated from the carrier to obtain the thinned flexible polyimide substrate of Example 2.

Comparative Example 1

The metal gel (containing nano silver having a particle diameter of 150±20 nm) was applied onto the glass carrier by spin coating, and subject to surface drying at 100° C. and sintering at a temperature of 250° C. to form a conductor layer. Next, the polyamic acid solution of Synthesis Example 3 was applied onto the conductor layer. After curing at 350° C., the conductor layer was separated from the carrier to obtain the thinned flexible polyimide substrate of Comparative Example 1.

Comparative Example 2

The metal gel (containing nano silver having a particle diameter of 50±20 nm) was applied onto the glass carrier by spin coating, and subject to surface drying at 100° C. and sintering at a temperature of 250° C. to form a conductor layer. Next, the polyamic acid solution of Synthesis Example 2 was applied onto the conductor layer. After curing at 350° C., the conductor layer was separated from the carrier to obtain the thinned flexible polyimide substrate of Comparative Example 2.

Comparative Example 3

The metal gel (containing nano silver having a particle diameter of 1500±400 nm) was applied onto the glass carrier by spin coating, and subject to surface drying at 100° C. and sintering at a temperature of 250° C. to form a conductor layer. Next, the polyamic acid solution of Synthesis Example 2 was applied onto the conductor layer. After curing at 350° C., the conductor layer was separated from the carrier to obtain the thinned flexible polyimide substrate of Comparative Example 3.

Comparative Example 4

The metal gel (containing nano silver having a particle diameter of 150±20 nm) was applied onto the glass carrier by spin coating, and subject to surface drying at 100° C. and sintering at a temperature of 250° C. to form a conductor layer. Next, the polyamic acid solution of Synthesis Example 4 was applied onto the conductor layer. After curing at 350° C., the conductor layer was separated from the carrier to obtain the thinned flexible polyimide substrate of Comparative Example 4.

TABLE 1

Comparison of properties of thinned flexible polyimide substrate

| EX./Comp. Ex. | Pull (kgf/cm) | Heat resistance (288° C.) | CTE (ppm/K) | Viscosity (dL/g) | Pore diameter (μm) | Dk/Df | Surface resistance (Ω/sq) | Appearance |
|---|---|---|---|---|---|---|---|---|
| Ex. 1 | 1.2 | Pass | 30 | 0.8 | 0.2 ± 0.05 | 3.3/0.004 | 0.07 | Smooth |
| Ex. 2 | 1.1 | Pass | 28.9 | 0.75 | 0.6 ± 0.2 | 3.1/0.01 | 0.08 | Smooth |
| Comp. Ex. 1 | 1.1 | NG | 60 | 1.2 | 0.2 ± 0.05 | 2.8/0.005 | 0.07 | Curly |
| Comp. Ex. 2 | NA | NA | 28.9 | 0.75 | 0.07 ± 0.02 | 3.2/0.01 | NA | Unable to be transferred completely |
| Comp. Ex. 3 | 0.6 | NG | 28.9 | 0.75 | 1.3 ± 0.2 | 3.1/0.01 | 459 | Smooth |

TABLE 1-continued

Comparison of properties of thinned flexible polyimide substrate

| EX./Comp. Ex. | Pull (kgf/cm) | Heat resistance (288° C.) | CTE (ppm/K) | Viscosity (dL/g) | Pore diameter (μm) | Dk/Df | Surface resistance (Ω/sq) | Appearance |
|---|---|---|---|---|---|---|---|---|
| Comp. Ex. 4 | NA | NG | 32 | 0.3 | 0.2 ± 0.05 | 3.1/0.02 | NA | Embrittlement |

The pull test measures the adhesion between the insulating layer and the conductor layer after the conductor layer is thickened by electroplating to 18 μm.
Heat resistance test immersed the test samples in a tin furnace at 288° C. for three consecutive cycles. If there is no peeling, it was judged PASS.
The CTE value is the CTE value of the polyimide insulating layer.
Surface resistance refers to the surface resistance of the transferred metal gel measured before the electroplating of the metal.

Table 1 compares the properties of the thinned flexible polyimide substrates of the Examples and the Comparative Examples. It can be seen from Comparative Example 1 that if the linear thermal expansion coefficient and viscosity of the polyimide are high, both the heat resistance and the compatibility between the metal layer and the polyimide layer will be poor, and the surface of the thinned flexible polyimide substrate will be curled. According to Comparative Example 2, if the metal gel having a small particle size of the metal nanoparticle (the pores of the conductor layer are small) is used, the polyimide may not be effectively filled into the pores of the conductor layer, such that the adhesion between the carrier and the conductor layer is greater than that between the polyimide layer and the metal layer. Under such circumstances, the carrier and the conductor layer are not easily separated, which means the conductor layer remains partially on the carrier, or remains completely on the carrier, and cannot be completely transferred to the polyimide layer. According to Comparative Example 3, when the metal gel having a large particle diameter of the metal nanoparticle is used (the pores of the conductor layer are large), the conductivity of the conductor layer is decreased, and the surface resistance is remarkably increased. According to Comparative Example 4, when the polyimide resin having a lower viscosity is used, it is not easy to form a film due to lower viscosity, leading to embrittlement of the thinned flexible polyimide substrate.

Example 3 Patterning of the Thinned Flexible Polyimide Substrate

The conductor layer of the thinned flexible polyimide substrate of Example 2 was attached with a dry film photoresist, which was bonded at a temperature of 100° C. and then exposed to ultraviolet light having an accumulated irradiation amount of 90 mJ. Subsequently, development was carried out by immersing in a calcium carbonate developing solution. The photoresist was rinsed with pure water to form a photoresist pattern having a plurality of lines with a width of 30 μm on the conductor layer. The metal layer was etched using an etching solution. After rinsing with pure water, the photoresist was removed using a 3% aqueous NaOH solution, so that a patterned polyimide substrate that was thinned and flexible was obtained. Finally, the wire was thickened by electroplating.

Example 4 Fabrication of Double-Sided Substrate

The PI resin surface of the thinned flexible polyimide substrate of Example 2 was coated with an epoxy resin adhesive and dried at a temperature of 90° C. The PI resin surface with epoxy resin adhesive was then bonded and pressed to the PI resin surface of another thinned flexible polyimide substrate. Finally, a substrate with double-sided conductor layers can be obtained after curing.

Although the present invention has been described above by way of example, such examples are not intended to limit the invention. These examples may be practiced or modified equivalently by those of ordinary skill in the art without departing from the spirit and scope of the invention, and therefore, the scope of the invention should be determined by the appended claims.

What is claimed is:

1. A thinned flexible polyimide substrate, comprising:
   a polyimide resin having a linear thermal expansion coefficient of less than 40 ppm/K;
   a conductor layer formed of a plurality of stacked metal nanoparticles having pores therebetween, each of the pores having a size between 0.1 μm and 1 μm, wherein a portion of the polyimide resin fills in the pores; and
   a polyimide insulating layer formed of the polyimide resin coated on the conductor layer.

2. The thinned flexible polyimide substrate of claim 1, wherein the polyimide resin is one of a thermoset polyimide resin, a thermoplastic polyimide resin, and a soluble polyimide resin.

3. The thinned flexible polyimide substrate of claim 1, wherein the polyimide resin is formed by polymerizing at least one dianhydride monomer and at least one diamine monomer,
   the at least one dianhydride monomer is selected from the group consisting of p-phenylene bis(trimellitate anhydride),
      2,2'-bis-(3,4-dicarboxyphenyl)hexafluoropropane dianhydride,
      4,4'-diphenylether tetraanhydride, pyromellitic dianhydride, biphenyltetracarboxylic dianhydride,
      3,3',4,4'-benzophenonetetracarboxylic dianhydride,
      3,3',4,4'-diphenylsulfonetetraanhydride, 4,4'-(hexafluoropropylene) bis-phthalic anhydride and 4,4'-(4,4'-isopropyldiphenoxy) bis(phthalic anhydride); and
   the at least one diamine monomer is selected from the group consisting of 4,4'-diaminodiphenyl ether, 4,4'-diaminodiphenylmethane,
      2,2'-bis[4-(4-aminophenoxy)phenyl]propane, 2,2'-bis[4-(4-aminophenoxy)phenyl]propane, 4,4'-diaminodiphenyl sulfone,
      3,3'-diaminodiphenyl sulfone, 1,3-bis(4-aminophenoxy)benzene,
      4,4'-diaminobenzanilide, (4-aminophenyl) 4-aminobenzoate,
      2-(4-aminophenyl)-5-aminobenzoxazole, di-p-aminophenyl terephthalate, p-phenylenediamine, 2,2'-bis(trifluoromethyl)benzidine, 4,4'-diamino-2,2'-dimethyl-1,1'-biphenyl and 2,2-bis[4-(4-aminophenoxy)phenyl]-1,1,1,3,3,3-hexafluoropropane.

4. The thinned flexible polyimide substrate of claim 1, wherein the polyimide resin has a viscosity value between 0.4 dL/g and 1.0 dL/g.

5. The thinned flexible polyimide substrate of claim 1, wherein the metal nanoparticles are made of silver, copper, nickel, gold, titanium, or a combination thereof.

6. The thinned flexible polyimide substrate of claim 1, wherein the metal nanoparticles have a particle size between 100 nm and 1000 nm.

7. The thinned flexible polyimide substrate of claim 1, wherein the conductor layer has a thickness between 500 nm and 3 μm.

8. A thinned flexible polyimide substrate with double-sided metal, comprising:
   two thinned flexible polyimide substrates of claim 1, wherein the polyimide insulating layers of the thinned flexible polyimide substrates are bonded with an adhesive to form a thinned flexible polyimide substrate with the conductor layer on both sides.

* * * * *